United States Patent
Arnold et al.

(10) Patent No.: US 8,470,706 B2
(45) Date of Patent: Jun. 25, 2013

(54) METHODS TO MITIGATE PLASMA DAMAGE IN ORGANOSILICATE DIELECTRICS

(75) Inventors: John C. Arnold, North Chatham, NY (US); Griselda Bonilla, Fishkill, NY (US); William J. Cote, Poughquag, NY (US); Geraud Dubois, Los Gatos, CA (US); Daniel C. Edelstein, White Plains, NY (US); Alfred Grill, White Plains, NY (US); Elbert Huang, Carmel, NY (US); Robert D. Miller, San Jose, CA (US); Satya V. Nitta, Poughquag, NY (US); Sampath Purushothaman, Yorktown Heights, NY (US); E. Todd Ryan, Clifton Park, NY (US); Muthumanickam Sankarapandian, Niskayuna, NY (US); Terry A. Spooner, Clifton Park, NY (US); Willi Volksen, San Jose, CA (US)

(73) Assignees: International Business Machines Corporation, Armonk, NY (US); Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/602,119

(22) Filed: Sep. 1, 2012

(65) Prior Publication Data
US 2012/0329269 A1 Dec. 27, 2012

Related U.S. Application Data

(62) Division of application No. 11/857,760, filed on Sep. 19, 2007.

(51) Int. Cl.
*H01L 21/4763* (2006.01)

(52) U.S. Cl.
USPC ............. 438/623; 257/E21.577; 257/E21.579

(58) Field of Classification Search
USPC ................. 438/623–626, 637, 639, 696, 677, 438/700; 257/E21.577, E21.579
See application file for complete search history.

(56) References Cited

U.S. PATENT DOCUMENTS

| 5,906,911 | A | 5/1999 | Cote |
| 6,093,508 | A | 7/2000 | Cote |
| 6,156,651 | A | 12/2000 | Havemann |
| 6,171,951 | B1 | 1/2001 | Lee et al. |

(Continued)

OTHER PUBLICATIONS

Cote, W., et al., "Non-Poisoning Dual Damascene Patterning Scheme for Low-k and Ultralow-k BEOL", Proceedings of 2006 Advanced Metallization Conference, pp. 43-44, Oct. 2006.

*Primary Examiner* — David Vu
(74) *Attorney, Agent, or Firm* — Scully, Scott, Murphy & Presser, P.C.; Louis J. Percello, Esq.

(57) ABSTRACT

Methods of minimizing or eliminating plasma damage to low k and ultra low k organosilicate intermetal dielectric layers are provided. The reduction of the plasma damage is effected by interrupting the etch and strip process flow at a suitable point to add an inventive treatment which protects the intermetal dielectric layer from plasma damage during the plasma strip process. Reduction or elimination of a plasma damaged region in this manner also enables reduction of the line bias between a line pattern in a photoresist and a metal line formed therefrom, and changes in the line width of the line trench due to a wet clean after the reactive ion etch employed for formation of the line trench and a via cavity. The reduced line bias has a beneficial effect on electrical yields of a metal interconnect structure.

15 Claims, 8 Drawing Sheets

U.S. PATENT DOCUMENTS

| | | |
|---|---|---|
| 6,312,793 B1 | 11/2001 | Grill et al. |
| 6,437,443 B1 | 8/2002 | Grill et al. |
| 6,475,929 B1 | 11/2002 | Gabriel et al. |
| 6,479,110 B2 | 11/2002 | Grill et al. |
| 6,599,840 B2 | 7/2003 | Wu et al. |
| 6,962,771 B1 | 11/2005 | Liu et al. |
| 7,005,390 B2 | 2/2006 | Ramachandrarao et al. |
| 7,071,126 B2 | 7/2006 | Johnston et al. |
| 7,179,758 B2 | 2/2007 | Chakrapani et al. |
| 7,416,956 B2 | 8/2008 | Yuan |
| 2002/0182872 A1 | 12/2002 | Wu et al. |
| 2005/0079705 A1 | 4/2005 | Takeuchi |
| 2005/0095840 A1 | 5/2005 | Bhanap et al. |
| 2005/0106762 A1 | 5/2005 | Chakrapani et al. |
| 2005/0208760 A1 | 9/2005 | Ryan |
| 2006/0046516 A1 | 3/2006 | Weber |
| 2006/0057837 A1 | 3/2006 | Bhanap et al. |
| 2006/0057855 A1 | 3/2006 | Ramos et al. |

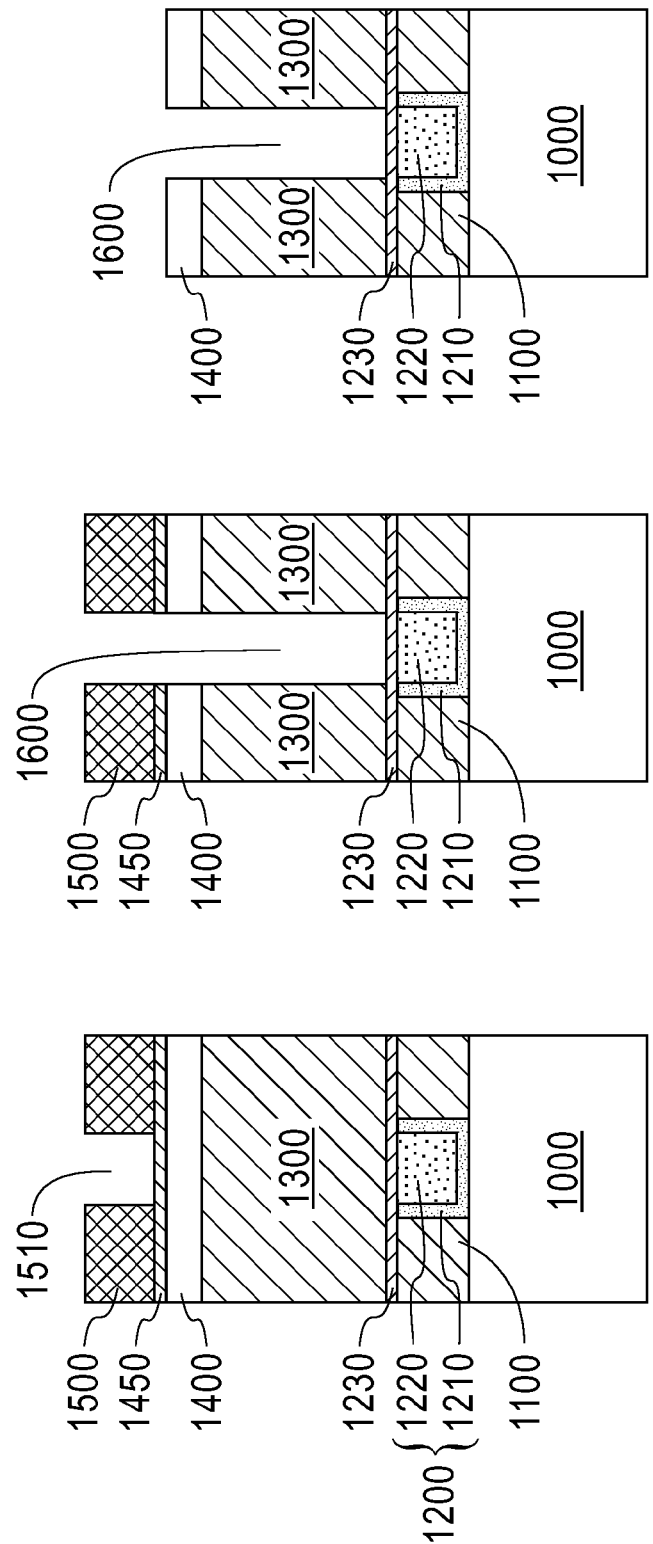

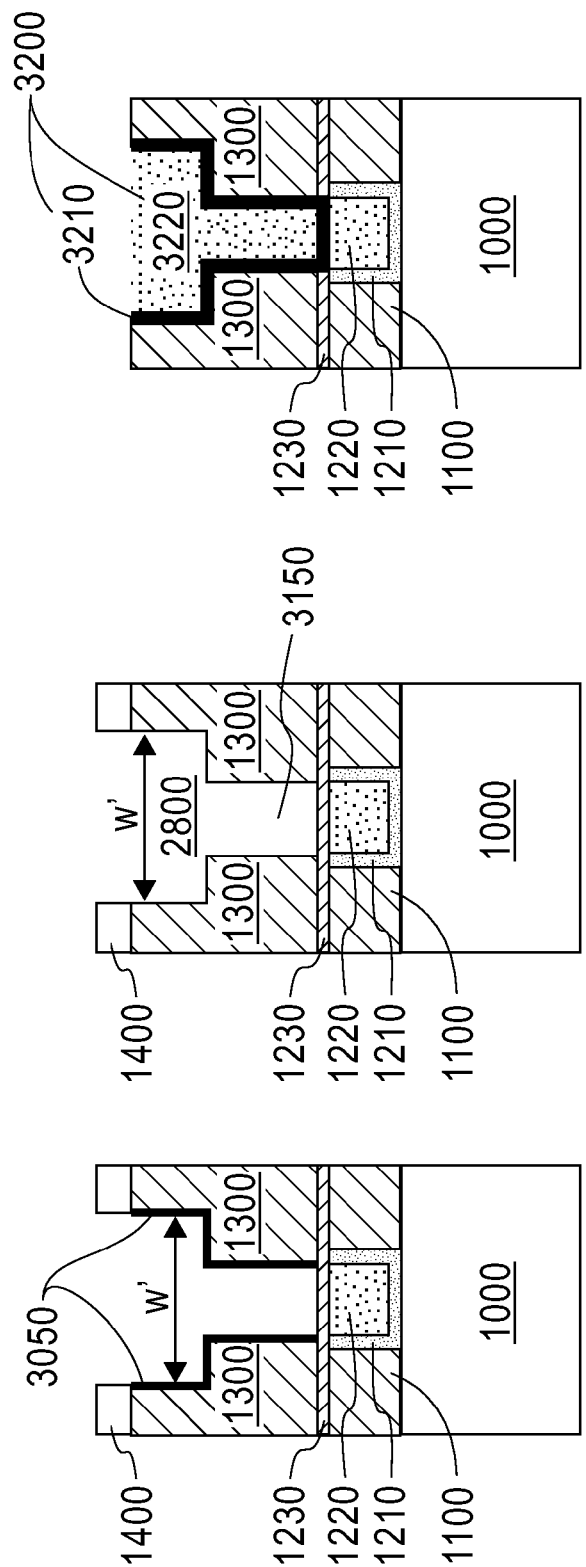

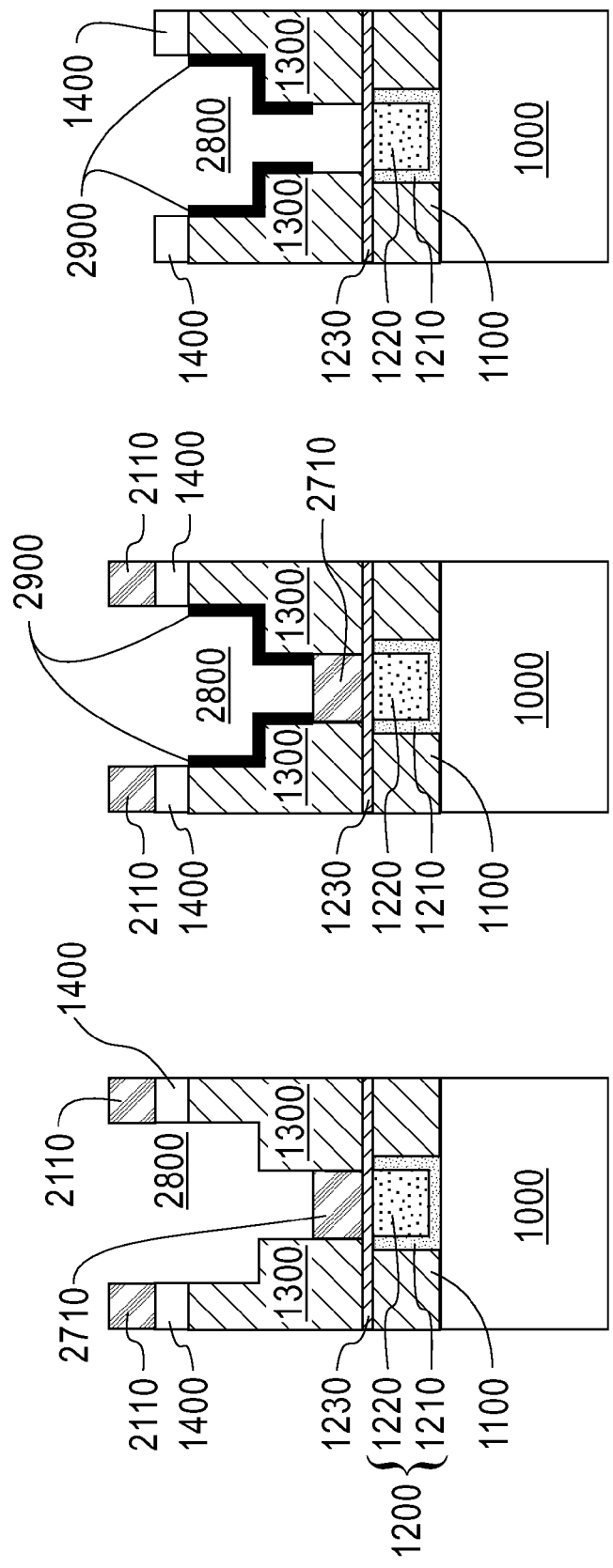

METHODS TO MITIGATE PLASMA DAMAGE IN ORGANOSILICATE DIELECTRICS

CROSS REFERENCE TO RELATED APPLICATIONS

This application is a divisional of U.S. patent application Ser. No. 11/857,760, filed Sep. 19, 2007, and is also related to U.S. patent application Ser. No. 11/857,805, now U.S. Pat. No. 7,781,332, which are incorporated herein by reference.

FIELD OF THE INVENTION

The present invention generally relates to methods of manufacturing a semiconductor structure, and particularly, to methods of manufacturing an interconnect structure having reduced signal propagation delay in a semiconductor circuit by minimizing plasma damage to low k and ultra low k organosilicate intermetal dielectric layers with a protective sidewall spacer.

BACKGROUND OF THE INVENTION

Advanced semiconductor chips, such as high performance microprocessor, microcontroller and communication chips, require high speed interconnect structures between individual semiconductor devices which are used to perform various functions such as logical operations, storing and retrieving data, providing control signals and the like. With the progress in the semiconductor device technology leading to ultra large scale integration, the overall speed of operation of the advanced semiconductor chips is approaching a limit due to signal propagation delay in interconnection wires, which are employed as the high speed interconnect structures, between the individual semiconductor devices on the same advanced semiconductor chip.

The signal propagation delay in an interconnect structure is dependent on an RC product of the interconnect structure, where R denotes the resistance of the interconnect wires and C denotes the interconnect capacitance, or the overall capacitance of the interconnect structure in which the interconnect wires are embedded. Use of copper instead of aluminum as the interconnect wiring material has allowed reduction of the resistance contribution to the RC product. Current focus in microelectronics industry is on reducing the interconnect capacitance by employing low dielectric constant (low k) dielectric materials in the interconnect structure of the advanced semiconductor chips, which typically contain a multilayered interconnect structure.

One prior art method of forming an interconnect structure with small feature sizes is the dual damascene (DD) process described, for example, in W. Cote et al, "Non-Poisoning Dual Damascene Patterning Scheme for Low-k and Ultra Low-k BEOL," Proceedings of 2006 Advanced Metallization Conference, pp. 43-44, October (2006). In general, a back end of the line (BEOL) interconnect structure comprises two types of features: metal lines that extend along in a horizontal direction across a semiconductor chip, and metal vias which extend vertically to connect metal lines at different levels of the BEOL interconnect structure. In the DD process, metal lines at a same level and metal vias located directly below the level of the metal lines are formed at the same processing step by filling line trenches formed at the same level and via holes formed directly below the level of the line trenches with metal, followed by planarization of the metal.

The level of the metal vias is referred to as a via level, which also comprises a via level dielectric material as well as the metal vias. The level of the metal lines is referred to as a line level, which also comprises a line level dielectric material as well as the metal lines. Historically, both the via level dielectric material and the line level dielectric material comprise an inorganic glass such as undoped silicate glass (USG) or a fluorosilicate glass (FSG), which is typically deposited by plasma enhanced chemical vapor deposition (PECVD). Recently, low dielectric constant (low k) organosilicate films comprising silicon, carbon, oxygen and hydrogen have been introduced as the via level dielectric material and the line level dielectric material to enable reduction in interconnect capacitance, and consequently, reduction in signal propagation delays in the advanced semiconductor chips.

A dual damascene process sequence is commonly employed to fabricate a back end of the line copper interconnect structures for the advanced semiconductor chips. One of the commonly used back end of the line integration scheme that employs the dual damascene process sequence is known as a "via first" integration scheme, in which via holes are formed first followed by formation of line trenches. Subsequently, metal vias are formed in the via holes and metal liners are formed in the line trenches during the same processing step that typically employs metal plating and chemical mechanical polishing (CMP).

An exemplary prior art via first integration scheme is schematically illustrated in FIGS. 1A-1I. Referring to FIG. 1A, a substrate 1000 containing at least one semiconductor device (not shown) is provided. The substrate 1000 may, or may not, comprise at least one interconnect wiring (not shown). A first intermetal dielectric (IMD) layer 1100 is formed on the substrate 1000 with a first level damascene metal line 1200 embedded therein. The first level damascene metal line 1200 typically comprises a first conductive diffusion barrier/adhesion layer 1210, which is often referred to as a barrier metal liner. The first level damascene metal line 1200 further comprises a first level metal line 1220, which typically comprises copper. A diffusion barrier dielectric layer 1230, which typically comprises silicon nitride, silicon carbide or silicon carbonitride, is deposited atop the embedded first level damascene metal line 1200 and the first IMD layer 1100.

A second intermetal dielectric (IMD) layer 1300 is then applied on top of the diffusion barrier dielectric layer 1230. The total thickness of the second IMD layer 1300 and the diffusion barrier dielectric layer 1230 is nominally equal to the sum of a target of a dual damascene line and a target height of a dual damascene via. As mentioned above, the first IMD layer 1100 and/or the second IMD layer 1300 typically comprise a low k (k<3.0) organosilicate dielectric material or an ultra low k (k<2.5) organosilicate dielectric material in the advanced semiconductor chips. The porosity level of the low k or ultra low k organosilicate dielectric materials increases as the dielectric constant k decreases.

A hard mask layer 1400 is deposited on top of the second IMD layer 1300 to protect the top surfaces of the IMD layer 1300 during subsequent lithography and etch processes. Typically the hard mask layer 1400 is an oxide layer formed by plasma enhanced chemical vapor deposition (PECVD) employing precursors such as silane, oxygen, or TEOS. Alternately, the hard mask layer 1400 may comprise silicon, carbon, oxygen, hydrogen (referred to as SiCOH), and optionally nitrogen, and is deposited employing precursors containing oxygen, silane, methylated silane, octamethyltetrasiloxane, and the like.

A first antireflective coating (ARC) layer 1450 is then applied to mitigate reflections from the first and second IMD layers (1100, 1300) during lithography. The first ARC layer 1450 typically comprises an optically absorptive organic material having a specific refractive index and a thickness tuned for this function. A first photoresist 1500 is applied and patterned by photolithography to form a via hole pattern 1510 within the layer of the first photoresist 1500 on top of the first ARC layer 1450.

Referring to FIG. 1B, the via hole pattern 1510 is sequentially transferred into the first ARC layer 1450, the hard mask layer 1400 and the second IMD layer 1300 using a reactive ion etch (RIE) process to produce a via hole 1600. A top surface of the diffusion barrier dielectric layer 1230 is exposed after the reactive ion etch.

Referring to FIG. 1C, remaining portions of the first photoresist 1500 and the first ARC layer 1450 are then stripped, for example, by a plasma ashing process. The strip process can be performed in the same process chamber as, or in a different process chamber from, the process chamber used for the RIE process of FIG. 1B. Typically, stripping damage is sustained by the second IMD layer 1300 during the strip process.

Referring to FIG. 1D, a disposable via fill material is applied over the hard mask layer 1400 to form a disposable via fill layer 2100, which fills the via hole 1600 and provides a substantially planar overfill over the hard mask layer 1400. The disposable via fill material may comprise an organic material that is capable of a gap fill of the via hole 1600. Preferably, the disposable via fill layer 2100 is self-planarizing. Non-limiting examples of the disposable via fill material include NFC1400™ produced by JSR Corporation™, Japan, and Accuflow™ produced by Honeywell Microelectronic Materials™, Sunnyvale, Calif.

Typically, the disposable via fill material is an organic material having a low molecular weight, i.e., having a molecular weight less than 100,000, and more preferably, having a molecular weight less than 30,000. The disposable via fill material has a gap fill property that enables filling the via hole 1600 with the disposable via fill material. The disposable via fill material also meets etch rate contrast requirements relative to the organosilicate dielectric material of the second ILD layer 1300.

A low temperature oxide (LTO) layer 2200 is deposited by a suitable deposition method such as plasma enhanced chemical vapor deposition (PECVD), chemical vapor deposition (CVD), or spin coating. Typically, a deposition temperature below 250° C. is desirable for the deposition of the LTO layer 2200. The disposable via fill material 2100 is thermomechanically stable during the deposition of the LTO layer 2200, and has a sufficient etch rate differential during a subsequent reactive ion etch (RIE) relative to the second IMD 1300 layer, which typically comprises an organosilicate glass. As will be seen subsequently, the disposable via fill layer 2100 provides the function of an RIE etch mask in the patterning of line trenches in the second IMD layer 1300.

A second antireflective coating (ARC) layer 2300 and a second photoresist 2400 are thereafter applied on top of the LTO layer 2200. The second photoresist 2400 is then patterned to form a line trench pattern 2500 within the layer of the second photoresist 2400 on top of the second ARC layer 2300.

Referring to FIG. 1E, the line trench pattern 2500 in the second photoresist 2400 is transferred by a RIE process into the second ARC layer 2300, the LTO layer 2200, and the disposable via fill layer 2100. During the RIE process, the second photoresist 2400 and the second ARC layer 2300 are typically consumed as they are etched concurrently with the etching of the exposed portions of the disposable via fill layer 2100. At the moment top surfaces of the hard mask layer 1400 are exposed, the remaining portions of the LTO layer 2200 constitutes a patterned LTO layer 2210, and remaining portions of the disposable via fill layer 2100 comprises a patterned disposable material layer 2110 and a via plug 2600.

Referring to FIG. 1F, as the RIE process continues, the patterned LTO layer 2210 is typically completely consumed during the etching of the hard mask layer 1400 and the early stage of etching of the second IMD layer 1300. The remaining portion of the via plug 2600 constitutes a disposable via fill plug 2710. The pattern transfer through the RIE process continues further into the second IMD layer 1300 employing the patterned disposable material layer 2110 as an etch mask to form a line trench 2800. The etch depth of line trench 2800 in the second IMD layer 1300 is determined based on the target height of a metal line in a completed dual damascene structure.

Referring to FIG. 1G, the patterned disposable material layer 2110 and disposable via fill plug 2710, both of which comprise the material of the disposable via fill material of the disposable via fill layer 2100 in FIG. 1D, are subsequently stripped using a plasma strip process. This plasma strip process induces most of the plasma damage in the second IMD layer 1300 since all the side walls of the line trench and the via opening are exposed to a strip plasma that needs to be aggressive enough to remove all of the patterned disposable material layer 2110 and the disposable via fill plug 2710. Any residual material from the disposable via fill plug 2710 left over in the via hole prevents or degrades a metal to metal contact between a fill metal to be formed at the via opening and the first level metal line 1220 when the dual damascene structure is metallized. Absence or degradation of the metal to metal contact results in low electrical yield.

Thus an optimally aggressive strip is normally employed in the plasma strip process. As a result, portions of the second IMD layer 1300 underneath the exposed sidewalls and horizontal surfaces of the second IMD layer 1300 are plasma damaged and chemically modified (loss of carbon content) to a certain depth to form a plasma damaged IMD region 3050. A first width W' of the line trench denotes the horizontal distance between the exposed sidewall surfaces of the plasma damaged IMD region 3050 in the line trench.

Referring to FIG. 1H, the diffusion barrier dielectric layer 1230 is etched by a RIE to open a contact hole to the first level damascene metal line 1200 underneath. A via cavity 3150 is formed between the line trench 2800 and the first level damascene metal line 1200. This processing step is often performed in a process chamber in the same tool cluster as the tool cluster containing the RIE chamber used for patterning of the metal line as shown in FIG. 1F. Further, the RIE chamber and the strip chambers are often part of a single tool cluster with a provision for transferring a substrate from one to the other without exposure to ambient air.

After completion of the plasma strip processing, a wet clean may optionally be employed to remove any residual material left in the via hole. The residual material may contain silicon since the residual material may be generated from reaction products of the second IMD layer 1300 and/or the hard mask layer 1400 with plasma gas species, or the residual material may comprise a resputtered silicon containing material from the second IMD layer 1300 and/or the hard mask layer 1400. A wet clean including a dilute hydrofluoric acid (DHF) treatment is often employed to effect the cleaning of the residual material. While being effective for silicon containing residual materials, the wet clean also tends to dissolve all or at least a large portion of the plasma damaged IMD region 3050. This results in an increase in the width of the line trench. A second width W" of the line trench denotes the horizontal distance between the exposed sidewall surfaces of the second IMD region 1300 in the line trench.

The second width W" is greater than the first width W' since the line trench 2800 widens during the wet clean. Depending on the extent of the plasma damaged IMD region 3050, the incremental change from the first width W' to the second width W" may be a significant fraction of the first width W'. To compensate for this incremental change, the corresponding line width in the line trench pattern 2500 in the second photoresist 2400 in FIG. 1D needs to be printed smaller than the second width by an amount equivalent to the sum of the etch bias during the transfer of the line trench pattern 2500 into the second IMD layer 1300 and the incremental change from the first width W' to the second width W". This lithographic constraint becomes a particularly challenging problem in the construction of high performance, high density metal interconnects in which fine line widths are required and porous ultra low dielectric constant IMD materials are employed since increased porosity renders the ultra low dielectric constant IMD materials prone to significant plasma damage, and consequently, a significant incremental change from the first width W' to the second width W".

Referring to FIG. 1I, the via cavity 3150 and the line trench 2800, which collectively constitute a dual damascene cavity (2800, 3150), are thereafter metallized, i.e., filled with metal by a plating process, followed by planarization, for example, by chemical mechanical polishing (CMP) to form a dual damascene metal interconnect structure 3200 which comprises a second conductive diffusion barrier/adhesion layer 3210 and second level integrated metal line and via 3220 which typically comprise copper. The processing steps of 1A-1I may be repeated to construct a multi-level dual damascene metal interconnect structure (not shown).

Alternate integration schemes may also be used for constructing a dual damascene metal interconnect structure in which a line trench is formed prior to formation of a via hole. While the sequence of process flow of the alternate integration schemes is different from the process flow of the via first integration scheme described above, the salient concerns regarding the exposure of the low k or ultra low k IMD material to plasma damage and widening of the line trench during a wet clean are also applicable to such alternate integration schemes.

In order to lower the interconnect capacitance, it is necessary to use lower k dielectrics such as PECVD or spin-on organosilicates which have k values in the range from about 2.7 to about 3.0 instead of a PECVD silicon dioxide based dielectrics having k values from about 3.6 to about 4.1. Structurally, the organosilicates have a silica-like backbone with alkyl or aryl groups attached directly to the Si atoms in the network. Their elemental compositions generally comprise Si, C, O, and H in various ratios. The C and H are most often present in the form of methyl groups (—$CH_3$). The primary function of the methyl groups is to create a free volume in, and reduce the polarizability of, layers of the organosilicates that are formed in a metal interconnect structure. A secondary function of the methyl groups is to add hydrophobicity to the organosilicates. The k value can be further reduced to 2.2 (ultra low k) and even below 2.0 (extreme low k) by introduction of porosity in the layers of the organosilicates. For the purpose of brevity, the ultra low k and extreme low k materials are herein collectively referred to as very low k materials.

Although a tunable range of k values is possible with this set of very low k materials, there are several difficulties in integrating these materials with copper interconnects in a dual damascene process sequence described above or by any other variation of the dual damascene process sequence. The main difficulty is that the organosilicates are very sensitive to a plasma exposure because of the relative ease of oxidation or cleavage of the Si-organic group linkage (for example, Si-methyl) which results in formation of silanol (Si—OH) groups in the film through a reaction with moisture in the ambient atmosphere. Silanols further absorb moisture and hence increase the dielectric constant and the dielectric loss factor of the film significantly, thus negating the performance benefits expected from the very low k material. Silanols also increase the electrical leakage in the very low k material, and thus create a potentially unreliable interconnect structure. Since reactive ion etch and plasma etch are key steps required in the formation of the line trench and via openings in the dual damascene process sequence and in the removal of photoresists used in patterning the very low k materials as described above, it is very difficult, if not impossible, to avoid plasma damage of the very low k material during a dual damascene process sequence known in the art.

While several attempts have been made to minimize the loss of hydrophobicity in the low k films using non-oxidizing resist strip plasmas consisting of some or all of He, $H_2$, $N_2$, CO etc., none of these plasma chemistries known in the art succeed in completely preventing the loss of hydrophobicity of the very low k materials. This is especially the case for porous low k materials which have a very large surface area, and consequently are susceptible to damage during the resist strip processes. Further, use of less damaging strip processes often limits the efficacy with which photoresist and a disposable via fill plug are removed. Reduction in the efficacy of the photoresist and the disposable via fill plug may in turn result in unwanted organic residues in the metal interconnect structure, which are detrimental to effecting good metal fills and metal to metal contacts in a multilevel metal interconnect structure. Thus the use of such mild stripping plasma processes tends to limit the overall process window of the DD process and yield.

Another method of circumventing the problem of plasma damage caused by a plasma strip process is use of fluorinated or non-fluorinated organic polymer based low k materials such as Dow Chemical's SiLK™ dielectric, Honeywell's Flare™, polyimides, benzocyclobutene, polybenzoxazoles, aromatic thermoset polymers based on polyphenylene ethers; chemical vapor deposited polymers such as poly(p-xylylene) which are not susceptible to damage during conventional plasma strip processes. However, these materials do not possess the other properties required of a low k dielectric material such as a low thermal expansion, high hardness, and small pore sizes provided by porous organosilicate materials. Hence, use of the fluorinated or non-fluorinated organic polymer based low k materials causes reliability concerns.

Methods of partially repairing and restoring properties of the plasma damaged organosilicate IMD layer up to some degree are known in the prior art. The most common of these methods is known as a silylation process, wherein the plasma damaged organosilicate IMD layer is exposed to suitable reaction agents known as silylation agents with a structural formula $X_n$—Si—$R_m$, where m+n=4, which react with the silanols in the plasma damaged organosilicate IMD layer. The reaction removes hydrogen from the —OH groups in the silanols forming a volatile product that can be removed, while leaving a Si—O—Si—R moiety in the plasma damaged organosilicate IMD layer. The resulting structure is hydrophobic due to the organic group R, and if the replacement is complete, that is, if all silanol groups are reacted with the agent, the dielectric properties of the plasma damaged organosilicate IMD layer can be partially restored. Examples of silylation agents include but not limited to mono-, di- or trichloro silane, mono-, di- or tri-ethoxy or methoxy silane, bis(dimethyl amino) dimethyl silane and the like. U.S. Pat. No. 7,179,758 to Chakrapani et al. discloses several preferred silylation agents and silylation reaction methodologies, and is herein incorporated by reference.

One limitation of these repair methods is the degree to which the damage can be remediated. The effectiveness of the repair could be affected by the relative size and reactivity of the silylation agent molecules and pore diameters in the ultra low k IMD layer as well as possible steric hindrance generated when one of the Si—OH sites has reacted with the agent molecule, thus restricting access for further reaction with a neighboring silanol site. As porosity levels are increased to lower the dielectric constant of the ultra low k IMD layer, the level of plasma damage tends to increase, and concomitantly as pore sizes are reduced to improve the properties of the ultra low k IMD layer, the ability to repair the damage after it has already been generated becomes more difficult.

In view of the above, there exists a need for a method for minimizing or preventing the plasma damage inflicted upon the ultra low k IMD layer during formation of a dual damascene metal interconnect structure, while retaining the capability to employ a plasma strip process required to enable full removal of photoresist and a disposable via fill plug used in the dual damascene process sequence.

Further, there exists a need for a method of forming a dual damascene metal interconnect structure in which the line width of a metal line is not significantly increased from the line width of a lithographic pattern used to define the same.

In addition, there exists a need for a method of forming a dual damascene metal interconnect structure in which a more manufacturable lithographic process window may be employed for forming fine metal lines required in high density BEOL metal interconnect structures.

SUMMARY OF THE INVENTION

The present invention addresses the needs described above by minimizing or eliminating plasma damage to low k and ultra low k organosilicate intermetal dielectric layers. The reduction of the plasma damage is effected by interrupting the etch and strip process flow at a suitable point to add an inventive treatment which protects the intermetal dielectric layer from plasma damage during the plasma strip process. Reduction or elimination of a plasma damaged region in this manner also enables reduction of the line width bias between a line pattern in a photoresist and a metal line formed therefrom, and changes in the line width of the line trench due to a wet clean after the reactive ion etch employed for formation of the line trench and a via cavity. The reduced line width bias has a beneficial effect on electrical yields of a metal interconnect structure.

In the present invention, a unique treatment or a process step is performed after the reactive ion etch patterning of a line trench and a via cavity and prior to a plasma strip process in which a photoresist and a disposable via fill plug is removed in a dual damascene process sequence. Multiple embodiments of the present invention differ in the specific details of the unique treatment or the process step.

In a first embodiment, a silylation reaction is employed to perform a surface treatment and as a consequence to form a modified surface layer, which is a protective layer that protects the material of a patterned intermetal dielectric (IMD) layer from plasma damage during a subsequent plasma strip process. The protective layer is selectively formed on exposed surfaces of the patterned IMD layer, while not modifying the photoresist or a disposable via fill plug in any substantial way. The protective layer shields the patterned IMD layer underneath during the plasma strip process so that plasma damage to the patterned IMD layer is reduced or eliminated.

In a variation of the first embodiment, a low power and low temperature plasma based deposition process is employed to selectively form a protective layer on exposed surfaces of the patterned IMD layer, while not coating the photoresist or the disposable via fill plug. The protective layer shields the patterned IMD layer underneath during the plasma strip process so that plasma damage to the patterned IMD layer is reduced or eliminated.

In a second embodiment, a sacrificial layer is formed on exposed surfaces of a patterned IMD layer. The sacrificial layer is consumed during a plasma strip process. However, plasma damage to the patterned IMD layer is reduced or eliminated due to the sacrificial layer.

Formation of the protective layer or the sacrificial layer may be performed either by removing a substrate from the etch and strip plasma tools to ambient air, loading the substrate into a separate processing tool, and performing the additional step in that tool; or by transferring the substrate in vacuum through a suitable load lock arrangement to another process chamber in the same tool cluster; or performed in the very same tool or process chamber where the etch and the plasma strip processes are carried out simply by changing the process gas ambient and temperature conditions. After the plasma strip process is completed, any residual portion of the protective layer or the sacrificial layer may be retained in the metal interconnect structure or removed by a wet clean that is typically employed in the dual damascene process sequence.

According to an aspect of the present invention, a method for fabricating an interconnect structure is provided, which comprises:

forming an intermetal dielectric layer on a substrate;

forming a via hole within the intermetal dielectric layer and filling a lower portion of the via hole with a disposable via fill material;

forming a line trench in the intermetal dielectric layer over the via hole;

depositing a protective layer on the intermetal dielectric layer, the protective layer comprising an organo-silicate material and having linked carbo-silane bonds; and performing a plasma strip to remove the disposable via fill material, while the protective layer protects the intermetal dielectric layer from damage during the plasma strip.

In one embodiment, the method further comprises:

forming a diffusion barrier dielectric layer on the substrate prior to the forming of the intermetal dielectric layer;

etching a contact hole through the diffusion barrier dielectric layer after the performing of the plasma strip; and filling the contact hole, the via hole, and the line trench with a conductive barrier metal liner and a conductive via fill material.

In another embodiment, the method further comprises:

forming a hard mask on the intermetal dielectric layer; and planarizing the conductive barrier metal liner and the conductive via fill material.

In even another embodiment, the hard mask layer comprises one of silicon oxide, silicon nitride, silicon-oxycarbide, and combinations thereof.

In yet another embodiment, the disposable via fill material is a spin coatable organic material having a molecular weight less than 100,000 and having a lower reactive ion etch rate than etch rates of the intermetal dielectric and the hard mask layer.

In still another embodiment, the substrate comprises a semiconductor material and contains at least one semiconductor device and at least one interconnect wiring.

In sill yet another embodiment, the diffusion barrier dielectric layer comprises at least one of silicon nitride, silicon carbide, and silicon-carbonitride material that is deposited by plasma enhanced chemical vapor deposition or spin on coating.

In a further embodiment, the intermetal dielectric layer comprises a porous organosilicate dielectric material, wherein the porous organosilicate dielectric material includes silicon, carbon, oxygen and hydrogen.

In even further embodiment, the plasma strip comprises at least one of reactive ion etching, plasma etching, and down stream ashing, and employs active plasma species including an oxidizing gas, a reducing gas, an admixture of the oxidizing gas and an inert gas, or an admixture of the reducing gas with the inert gas, wherein the oxidizing gas includes at least one of oxygen, water vapor, and carbon dioxide, the reducing gas includes at least one of ammonia and hydrogen, and the inert gas includes at least one of nitrogen, argon, and helium.

In yet further embodiment, the protective layer comprises at least one of organosilicate materials with carbosilane functional groups containing bridged silicon-carbon-silicon bonds and organosilicate materials with pendant groups selected from alkyl, allyl and aryl moieties.

In still further embodiment, the protective layer is deposited by a plasma enhanced chemical vapor deposition using a precursor gas selected from silanes, carbosilanes, and siloxanes at a temperature of about 400° C. or less.

According to another aspect of the present invention, another method for fabricating an interconnect structure is provided, which comprises:

forming an intermetal dielectric layer on a substrate;

forming a hard mask directly on said intermetal dielectric layer;

forming a via hole within said hard mask and within said intermetal dielectric layer and filling a lower portion of said via hole with a disposable via fill material;

forming a line trench in said intermetal dielectric layer over said via hole;

forming a protective layer on sidewalls of said line trench and on sidewalls of an upper portion of said via hole, while keeping a bottom surface of said line trench exposed, said protective layer comprising an organo-silicate material and having linked carbo-silane bonds; and performing a plasma strip to remove said disposable via fill material, while portions of said intermetal dielectric layer underneath said sidewalls of said line trench and underneath sidewalls of an upper portion of said via hole are protected by said protective layer from damage during said plasma strip.

In one embodiment, the protective layer is deposited by a silylation process by reacting exposed sidewalls of the intermetal dielectric and the hard mask with a silylation agent delivered in a vapor phase, liquid phase or in a supercritical carbon dioxide medium.

In another embodiment, the silylation process may be performed in one of a group consisting of a stand alone vapor phase reaction chamber, a spin coat and baking tool, a vapor phase reaction chamber attached to a plasma processing tool cluster, and a supercritical fluid reactor, and wherein the silylation process is performed at a temperature from about 25° C. to about 400° C.

Various types and examples of the silylation agent are provided in the present invention.

In yet another embodiment, a plurality of silylation agents is delivered concurrently or sequentially.

According to yet another aspect of the present invention, yet another method for fabricating an interconnect structure is provided, which comprises:

forming an intermetal dielectric layer on a substrate;

forming a hard mask directly on the intermetal dielectric layer;

forming a via hole within the hard mask and within the intermetal dielectric layer and filling a lower portion of the via hole with a disposable via fill material;

forming a line trench in the intermetal dielectric layer over the via hole;

forming a sacrificial layer on sidewalls and a bottom surface of the line trench and on sidewalls of an upper portion of the via hole, wherein the sacrificial layer includes a polymeric material containing one or more of carbon, hydrogen, fluorine, and silicon; and performing a plasma strip to remove the disposable via fill material, while portions of the intermetal dielectric layer underneath the sidewalls and the bottom surface of the line trench and underneath sidewalls of an upper portion of the via hole are protected by the sacrificial layer from damage during the plasma strip, wherein the sacrificial layer is consumed during the plasma strip.

In one embodiment, the sacrificial layer is formed by a plasma process employing at least one feed gas selected from the group consisting of $C_4F_8$, $C_2F_6$, $CHF_3$, and $CH_2F_2$.

In another embodiment, the polymeric material is formed by employing a plasma bias that promotes energetic ion bombardment.

In yet another embodiment, the sacrificial layer is formed by an acid catalyzed ring opening polymerization reaction employing at least one of epoxy (meth)acrylates, oxetanes, caprolactones, lactides, butyrolactones, and tetrahydrofuron (THF).

In still another embodiment, the sacrificial layer is one of styrene, alpha methyl styrene, vinyl acetate, and vinyl ethers.

In still yet another embodiment, the method comprises:

attaching initiators selected from the group consisting of functional alkyl amine initiators and dithioesters to the sidewalls of the line trench and to the sidewalls of an upper portion of the via hole; and a selective initiation employing vinyl monomers from the sidewalls of the line trench and from the sidewalls of an upper portion of the via hole.

BRIEF DESCRIPTION OF THE DRAWINGS

FIGS. 1A-1I are sequential vertical cross-sectional views of an exemplary prior art metal interconnect structure employing an exemplary prior art via first integration scheme including a dual damascene process sequence.

FIGS. 2A-2E are sequential vertical cross-sectional views of a first exemplary metal interconnect structure in which plasma damage reduction is effected by formation of an inventive protective layer according to a first embodiment of the present invention.

DETAILED DESCRIPTION OF THE INVENTION

Figures 1D, 1E, 1F:
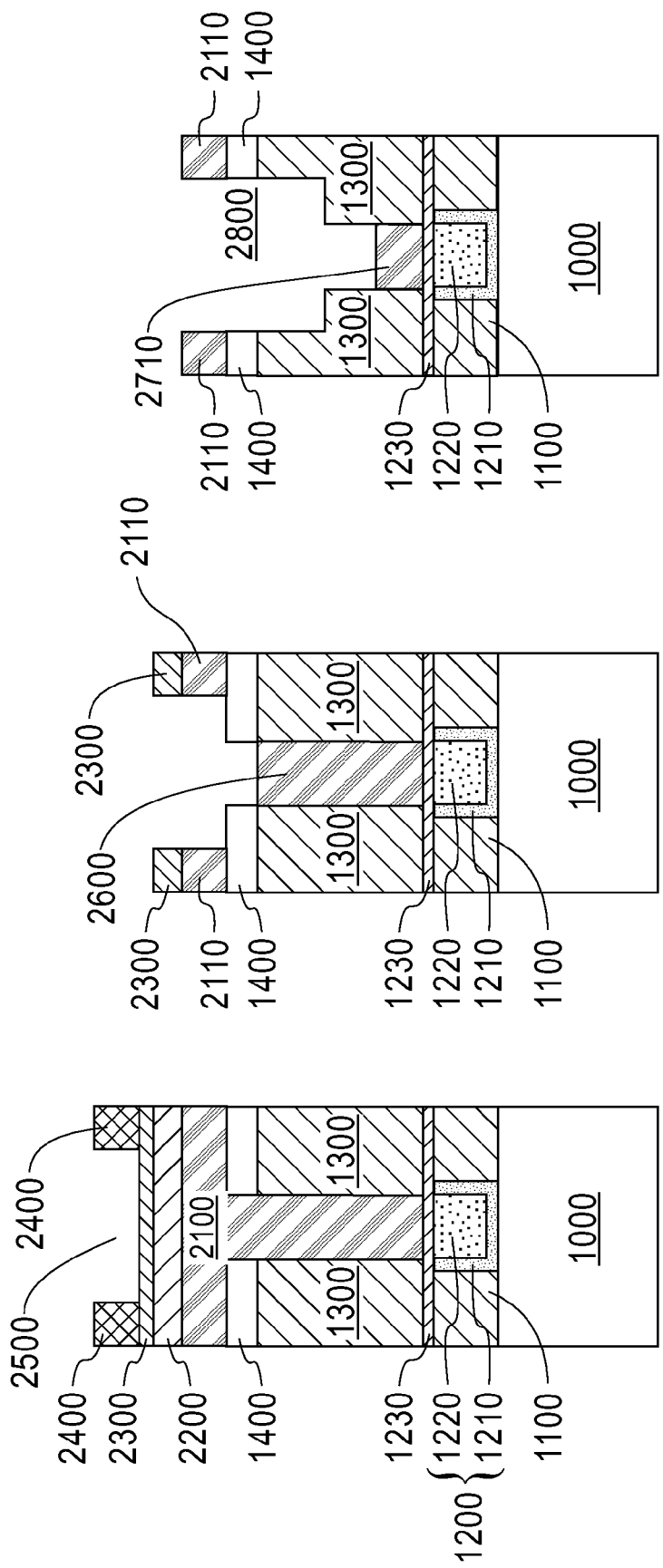

As stated above, the present invention relates to methods of manufacturing a metal interconnect structure that reduces signal propagation delay in a semiconductor circuit by minimizing or eliminating plasma damage to low k and ultra low k organosilicate intermetal dielectric layers. It is noted that like and corresponding elements mentioned herein and illustrated in the drawings are referred to by like reference numerals.

The following terms are employed herein:

As defined herein, the term "alkyl", alone or in combination with any other term, refers to a straight-chain or branch-chain saturated aliphatic hydrocarbon radical containing the specified number of carbon atoms, or where no number is specified, preferably from 1-16 and more preferably from 1-5 carbon atoms. Examples of alkyl radicals include, but are not limited to, methyl, ethyl, n-propyl, isopropyl, n-butyl, isobutyl, sec-butyl, tert-butyl, pentyl, isoamyl, n-hexyl and the like.

The term "aryl", when used alone or in combination, refers to an aromatic group which contains from 6 up to 18 ring carbon atoms and up to a total of 25 carbon atoms and includes the polynuclear aromatics. The aryl group may be monocyclic, bicyclic, tricyclic or polycyclic and are fused rings. The aryl group includes phenyl, and the polynuclear aromatics, e.g., naphthyl, anthracenyl, phenanthrenyl, azulenyl and the like. The aryl group also includes groups like ferrocyenyl.

The term "alkenyl", alone or in combination with any other term, refers to a straight-chain or branched-chain mono- or poly-unsaturated aliphatic hydrocarbon radical containing the specified number of carbon atoms, or where no number is specified, preferably from 2-16 carbon atoms and more preferably, from 2-6 carbon atoms. Examples of alkenyl radicals include, but are not limited to, ethenyl, propenyl, isopropenyl, butenyl, isobutenyl, pentenyl, hexenyl, hexadienyl and the like.

Embodiment 1:

Use of a Protective Layer

In embodiment 1, or the first embodiment, of the present invention, the integration sequence including the dual damascene etch and the plasma strip process described in FIGS. 1A-1I and accompanying paragraphs is interrupted after the patterning of the line trench 2800 in the second intermetal dielectric (IMD) layer 1300 and prior to removal of the patterned disposable material layer 2110 and the disposable via fill plug 2710. In other words, the prior art dual damascene process sequence described in FIGS. 1A-1F and accompanying paragraphs above are employed. For the sake of clarity, the prior art metal interconnect structure of FIG. 1F is reproduced as FIG. 2A with the same reference numerals. Thus, the first exemplary metal interconnect structure according to the first embodiment of the present invention shown in FIG. 2A is substantially the same as the prior art structure of FIG. 1F, and may be derived by the same processing steps known in the art.

Optionally, a short and mild plasma strip process or a mild wet clean that does not substantially alter the first exemplary metal interconnect structure may be performed at this point to remove any surface polymer that may be present on the sidewalls and horizontal surfaces of the second IMD layer 1300. Process parameters of such a treatment are chosen in strength and duration to be mild, and are not intended for any substantial removal of the disposable via fill plug 2710.

Referring to FIG. 2B, a protective layer 2900 is selectively deposited on the sidewalls of the second IMD layer 1300 and optionally on the sidewalls of the hard mask layer 1400. Formation of the protective layer 2900 may simultaneously modify the sidewall surfaces and horizontal surfaces of second IMD layer 1300 on which the protective layer 2900 is formed. The selective deposition may be performed in a stand alone tool into which the first exemplary metal interconnect structure on the substrate 1000 is introduced and processed. Alternately the selective deposition may be performed in a chamber that is part of a clustered tool configuration that contains a reactive ion etch (RIE) chamber and a plasma strip chamber, from and to which the first exemplary metal interconnect structure on the substrate 1000 may be transferred through a suitable vacuum load lock arrangement.

Preferably, the protective layer 2900 is resistant to a plasma strip process to be subsequently employed to remove the disposable via fill plug 2710. Optionally, the protective layer 2900 may be modified after the plasma strip process in a manner that allows easy removal of the remaining portions of the protective layer 2900 by a subsequent wet clean. The second IMD layer 1300 is not directly exposed to the plasma of the plasma strip process that is employed to remove the disposable via fill plug 2710.

One method by which exposed surfaces of the second IMD layer 1300 may be modified to form the protective layer 2900 is a silylation process using a silylation agent. Several methods and chemical agents which can be used for silylation of a plasma strip modified intermetal dielectric (IMD) films are described in the '758 patent referenced above. However, in addition to the silylation agents described therein, newly disclosed carbosilane based (containing —Si—C—Si— bonds) silylation agents that are specifically tailored to form the protective layer 2900 may be advantageously used according to the present invention. Further, the silylation is performed as a step that is interposed between a short plasma strip or clean step and the final plasma strip in the present embodiment of this present invention. In the '758 patent silylation is taught as being performed after all the etch, full plasma strip and dielectric diffusion barrier contact etch steps are completed.

Examples of carbosilane based silylation agents include, but are not limited to, the following carbosilane containing silylation agents, which are referred to type 1 through type 6 carbosilane agents herein.

Type 1 carbosilane containing silylation agents include but are not limited to compounds of the structural formula,

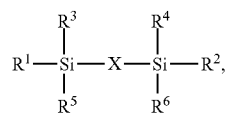

wherein X=—$(CH_2)_n$—, n=1-8, and $R^1$-$R^6$ are alkoxy, alkyl, allyl, aryl, hydrogen, halogen, acetoxy, dialkylamino. Each of $R_1$-$R_6$ may be independently selected.

Non-limiting examples of the type 1 carbosilane containing silylation agents include:

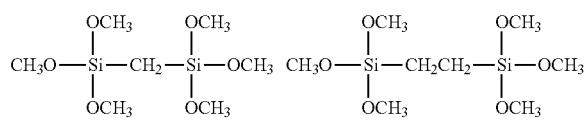

Bis(trimethoxysilyl)methane    Bis(trimethoxysilyl)ethane

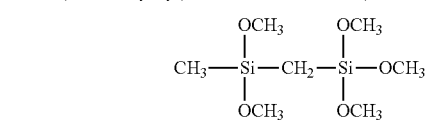

1-(Trimethoxysily)-1-(dimethoxymethylsilyl)methane

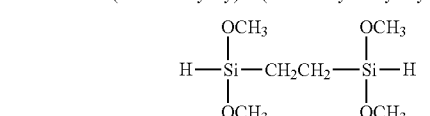

Bis(dimethoxysilyl)ethane

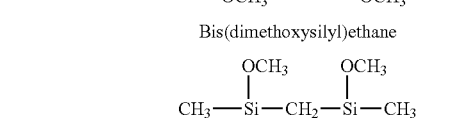

Bis(dimethoxymethylsilyl)methane

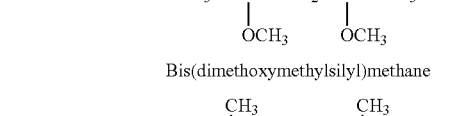

Bis(dimethoxymethylsilyl)ethane

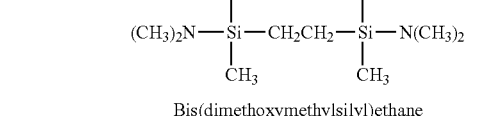

1-(Triethoxysilyl)-2-(diethoxymethylsilyl)ethane

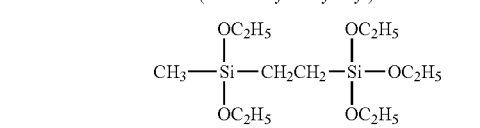

1-(Dimethoxymethylsilyl)-1-(dimethoxysilyl)methane

A sub-class of type 1 carbosilane containing silylation agents has a Si—CH$_2$—CH$_2$—Si bonding in a cyclic compound as exemplified by the general structure

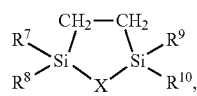

wherein each $R^7$-$R^{10}$ is independently alkyl, aryl, allyl, or alkenyl, and X is one of O, NH, NR.

Non-limiting examples of the sub-class of type 1 carbosilane containing silylation agents include:

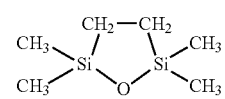

2,2,5,5-Tetramethyl-2,5-disila-1-oxacyclopentane

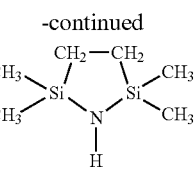

2,2,5,5-Tetramethyl-2,5-disila-1-azacyclopentane

Type 2 carbosilane containing silylation agents containing aryl, which is known to have good chemical resistance to plasma strip, may also be used. Non-limiting exampled include:

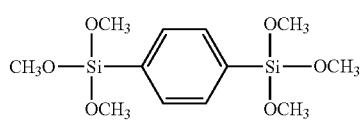

1,4-Bis(trimethoxysilyl)benzene

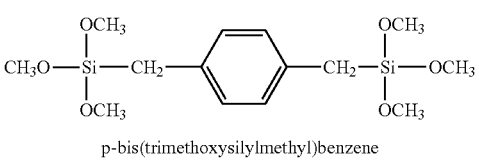

p-bis(trimethoxysilylmethyl)benzene

Type 3 carbosilane containing silylation agents have a relatively large molecular size typically greater than about 2 nm, which prevents their diffusion into the dielectric matrix and thus favoring silanol reactions to occur at the surface of the IMD.

A first subclass of the type 3 carbosilane containing silylation agents is of the structural formula:

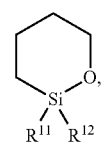

wherein each of $R^{11}$ and $R^{12}$ is independently alkyl, aryl, allyl, or hydrogen.

For example, the first subclass of the type 3 carbosilane containing silylation agents include 1,1-dimethyl-1-sila-2-oxacyclohexane.

A second subclass of type 3 carbosilane containing silylation agents is of the structural formula:

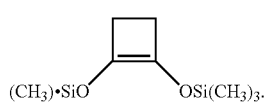

For example, the second subclass of type 3 silylation agents include 1,2-bis(trimethylsiloxy)cyclobutene.

A third subclass of type 3 carbosilane containing silylation agents is of the structural formula:

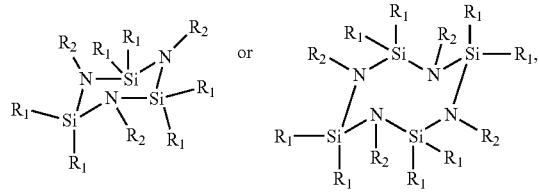

wherein each $R_1$ is independently alkyl, aryl, allyl, alkenyl, or hydrogen and each $R_2$ is alkyl or hydrogen. For example, the third subclass of type 3 silylation agents include 1,1,3,3,5,5-hexamethylcyclotrisilazane and 1,2,3,4,5,6-hexamethylcyclotrisilazane, as well as 1,1,3,3,5,5,7,7-octamethylcyclotetrasilazane and 1,2,3,4,5,6,7,8-oxtamethylcyclotetrasilazane.

A fourth subclass of type 3 carbosilane containing silylation agents is of the structural formula:

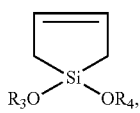

wherein each of $R_3$ and $R_4$ is independently alkyl, aryl, allyl or alkenyl.

For example, the fourth subclass of type 3 carbosilane containing silylation agents include 1,1-diethoxy-1-silacyclopent-3-ene.

Type 4 carbosilane containing silylation agents comprise silylation agents which can react with silanols at elevated temperatures. Some of non-limiting examples is of a structural formula:

wherein each $R_5$ is independently alkyl, aryl, allyl, alkenyl, hydrogen, alkoxy, or halogen.

Non-limiting specific examples include 1,1,3,3-tetramethyl-1,3-disilacyclobutane; cyclotrimethylenedichlorosilane; cyclotrimethylenedimethylsilane; cyclotrimethylenemethylchlorosilane; N-alkyl substituted 2,2,5,5-tetramethyl-2,5-disila-1-aza cyclopentane; 3-methylene-2,2,5,5-tetramethyl-2,5-disila-1-oxycyclopentane; 3-alkyl-2,2,5,5-tetramethyl-1,3-sila-1-oxacyclopent-3-ene; derivatives of 2,4,6,8-tetramethylcyclotetrasiloxane with hydrido, vinyl substituents at positions 2,4,6,8, aryl substituents at positions 2,4,6,8, and carbosilane dimer 2,2,4,4,6,6,8,8-octamethyl-1,5-dioxa-2,4,6,8-tetrasilacyclooctane.

Type 5 carbosilane containing silylation agents are highly reactive agents which incorporate nitrogen containing groups into the damaged IMD region. One example of the type 5 silylation agents is:

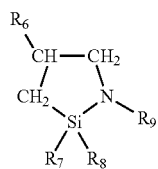

wherein each of $R_6$, $R_7$, $R_8$, and $R_9$ is independently alkyl, alkenyl, allyl, aryl, or hydrogen, and $R_4$ is one of alkyl, aryl, hydrogen.

Type 6 carbosilane containing silylation agents render a high degree of hydrophobicity to the IMD surface by virtue of a large number of pendant organic moieties and a group that is strongly reactive with silanols in the damaged IMD. An example of the type 6 silylation agents is a class of disilane derived agents of the structural formula:

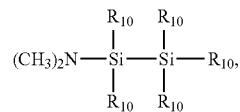

wherein $R_{10}$ is independently alkyl, aryl, allyl, alkenyl, or hydrogen.

The carbosilane containing silylation agents of the present invention may be used alone, in mixtures applied concurrently, or in sequential exposures to react with the sidewall and horizontal surfaces of the second IMD layer 1300. The carbosilane containing silylation agents are introduced in liquid phase, in vapor phase, or in the form of a mixture with supercritical fluids such as supercritical carbon dioxide as disclosed in the '758 patent mentioned above. In case the hard mask layer 1400 comprises silicon oxide or an organosilicate material, the carbosilane containing silylation agents is likely to react with the exposed sidewalls of the hard mask 1400, which does not adversely affect practice of the present invention. However, the carbosilane containing silylation agents do not react with the disposable via fill material, and hence do not deposit on or modify the disposable via fill material in the disposable via fill plug 2710 or in the patterned disposable material layer 2110. Thus the disposable via fill plug 2710 and the patterned disposable material layer 2110 are left in a state amenable to subsequent removal by a plasma strip process.

Other agents that may be applied in a liquid form by a spin on process and reacted preferentially with exposed surfaces of the second IMD layer 1300 include polymeric and oligomeric siloxanes and derivatives thereof. Non-limiting examples include chloro, amino, alkoxy terminated polydimethylsiloxane; oligomeric versions of the polymers with same terminations as above but having shorter chain lengths; and polymeric siloxanes of a structural formula $\{(R_{11},R_{12})—Si—O—Si(R_{11},R_{12})\}_n$, wherein $R_{11}$ and $R_{12}$ are pendant groups attached to the Si atom in the siloxane network and may be independently selected from amino, alkoxy, alkyl, allyl and aryl groups. As the molecular weight and boiling point of these types of compounds is generally high, i.e., greater than 150° C. or so, these compounds are more suited for liquid phase application either as is or in a suitable solvent. A subsequent thermal treatment to enable reaction with the second IMD layer 1300 and removal of any unreacted portions of the compound and solvents may optionally be employed.

The protective layer 2900 may also be selectively formed on the exposed surfaces of the second IMD layer 1300 and the sidewalls of the hard mask layer 1400 by a plasma enhanced chemical vapor deposition (PECVD) using a precursor gas selected from silanes, carbosilanes and siloxanes at a temperature of about 400° C. or less. In such processes, the exposed surfaces of the second IMD layer 1300 and the sidewalls of the hard mask layer 1400 are active surfaces that enable preferential nucleation and growth of the protective film from the vapor of precursors introduced into a PECVD process chamber, while pervasive nucleation and growth of material do not occur on other surfaces. An exemplary process employs octamethylcyclotetrasiloxane (OMCTS) as a precursor at low temperature to selectively form a SiCOH dielectric on the exposed sidewalls and horizontal surfaces of second IMD layer 1300 and the sidewalls of the hard mask layer 1400. The SiCOH dielectric contains a matrix of a hydrogenated oxidized silicon carbon material (SiCOH) comprising atoms of Si, C, O and H in a covalently bonded tri-dimensional network. Low density oraganosilicate or silicon oxide films that provide pore sealing of ultra low k dielectric material may also be employed to form the protective layer 2900.

Referring to FIG. 2C, once the protective layer 2900 is applied, the first exemplary metal interconnect structure on the substrate 1000 is transferred to a plasma strip chamber to effect removal of the patterned disposable material layer 2110 and the disposable via fill plug 2710. A suitably aggressive strip process may be employed for this removal process since the second IMD layer 1300 and the hard mask layer 1400 are protected by the protective layer 2900. The protective layer 2900 may be partially removed or modified in chemical composition. Little or no plasma damage is imparted to the second IMD layer 1300 or the hard mask layer 1400 during the plasma strip process.

Figure 2D:
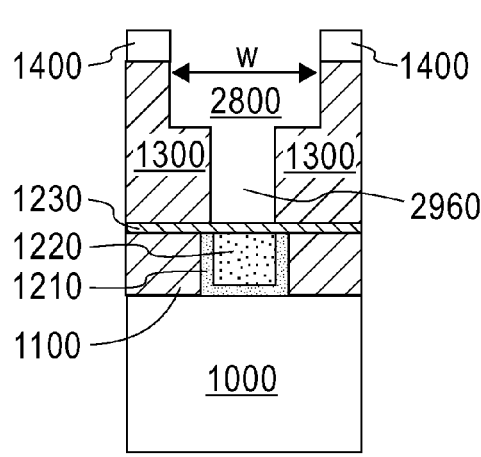

Referring to FIG. 2D, another reactive ion etch (RIE) is performed to selectively open a contact hole in the diffusion barrier dielectric layer 1230. Not necessarily but preferably, a wet clean is subsequently performed in a suitable medium such as dilute hydrofluoric (DHF) acid solution to remove any residual material from the plasma strip process. The protective layer 2900 may be removed simultaneously with the removal of the residual material. A dual damascene cavity comprising the line cavity 2800 and a via cavity 2960 are formed.

In comparison with the exemplary prior art metal interconnect structure of FIG. 1H, the line width W in FIG. 2D is smaller than the second width W'' in FIG. 1H for a given lithographic dimension for the line trench pattern 2500 of FIG. 1D. Instead, the line width W is substantially the same as the first width W' in FIG. 1G. The difference between the line width W in FIG. 2D and the second width W'' in FIG. 1H is due to the formation of the plasma damaged IMD region 3050 in the processing steps corresponding to FIG. 1G and subsequent removal of the plasma damaged IMD region 3050 by a wet clean. Since the thickness of the plasma damaged IMD region 3050 in FIG. 1G by the prior art process is substantial, the difference between the second width W'' and the first width W' is also substantial.

In the prior art, the lateral thickness of the plasma damaged IMD regions 3050, and hence the difference between the second width W'' and the first width W' increase as the porosity of the second IMD layer 1300 increases to enable low k values. Use of a long and aggressive plasma strip process, which is required to ensure complete removal of the disposable via fill material from the patterned disposable material layer 2110 and disposable via fill plug 2710, increases the extent of damage to the second IMD layer 1300, and consequently, the lateral thickness of the plasma damaged region 3050 and the lateral enlargement of the line trench 2800 by the difference between the second width W'' and the first width W' of the exemplary prior art metal interconnect structure. Lithographic processes are currently forced to provide smaller feature sizes to account for this anticipated lateral enlargement of the line trench 2800, which renders the lithographic processes expensive and less manufacturable. As discussed above, less aggressive plasma strip processes are being explored, but currently do not always ensure a complete removal of the disposable via fill material from the patterned disposable material layer 2110 and disposable via fill plug 2710.

In contrast, the use of the selectively formed protective layer 2900 of the first embodiment of the present invention protects the second IMD layer 1300 from plasma damage during the plasma strip process, and hence avoids such a lateral enlargement of the line trench 2800. As a result, more relaxed lithographic processes and more aggressive plasma strip processes may be employed, thus allowing for lower cost, improved manufacturability and higher yield compared to the manufacturing processes known in the art.

Figure 2E:
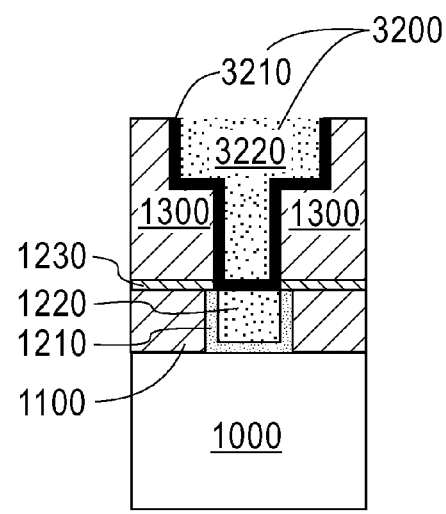

Referring to FIG. 2E, metallization, plating, and planarization are performed to form a dual damascene metal interconnect structure 3200 which comprises a second conductive diffusion barrier/adhesion layer 3210 and second level integrated metal line and via 3220 which typically comprise copper. The inventive processing steps may be repeated to construct a multi-level dual damascene metal interconnect structure (not shown).

Embodiment 2

Use of a Sacrificial Layer

In embodiment 2, or the second embodiment, of the present invention, the integration sequence including the dual damascene etch and the plasma strip process described in FIGS. 1A-1I and accompanying paragraphs is interrupted after the patterning of the line trench 2800 in the second intermetal dielectric (IMD) layer 1300 and prior to removal of the patterned disposable material layer 2110 and the disposable via fill plug 2710 as in the first embodiment. For the sake of clarity, the prior art metal interconnect structure of FIG. 1F is reproduced as FIG. 3A with the same reference numerals. Thus, the second exemplary metal interconnect structure according to the second embodiment of the present invention shown in FIG. 3A is substantially the same as the prior art structure of FIG. 1F, and may be derived by the same processing steps known in the art.

Optionally, a short and mild plasma strip process or a mild wet clean that does not substantially alter the first exemplary metal interconnect structure may be performed at this point as in the first embodiment.

Figures 3A, 3B:
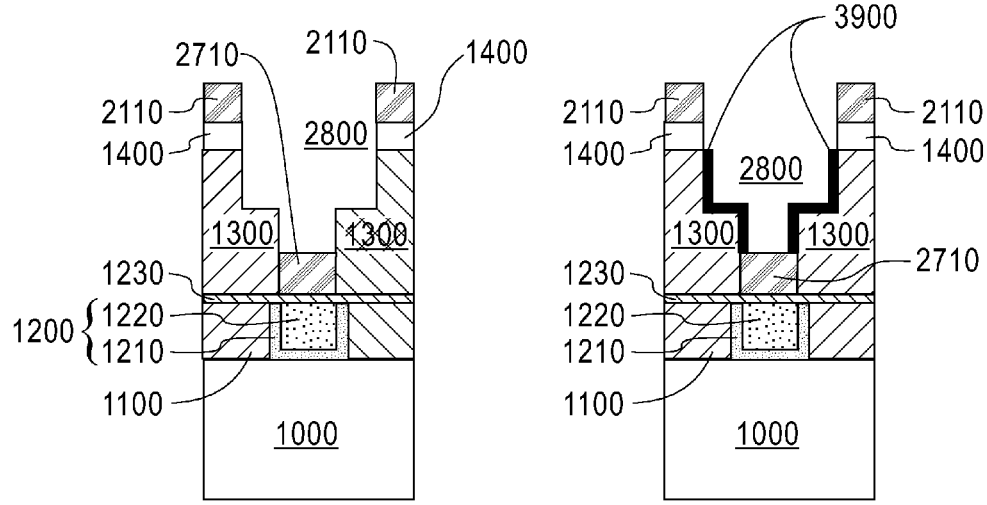
FIGS. 3A-3D are sequential vertical cross-sectional views of a second exemplary metal interconnect structure in which plasma damage reduction is effected by formation of an inventive sacrificial layer according to a second embodiment of the present invention.

Referring to FIG. 3B, a sacrificial layer 3900 is deposited selectively on the exposed surfaces of the second IMD layer 1300 and the sidewalls of the hard mask layer 1400. The sacrificial layer 3900 is formed on the sidewalls of the second IMD layer 1300 and exposed horizontal surfaces of the second IMD layer 1300, which are horizontal surfaces of the line trench 2800. The material of the sacrificial layer 3900 is selected such that the sacrificial layer 3900 is sacrificially removable during a subsequent plasma strip process of the disposable via fill material and/or a subsequent wet clean, but protects the second IMD layer 1300 from a direct exposed to the full effect of these processes.

Not necessarily but preferably, the sacrificial layer 3900 comprises a sacrificial coating material, and may be formed by a thermal or plasma assisted deposition in a process chamber capable of providing a vacuum environment. By controlling the deposition temperature and/or plasma conditions in case plasma enhancement is employed, the sacrificial layer 3900 is deposited selectively on active surfaces comprising the exposed surfaces of the second IMD layer 1300 and the sidewalls of the hard mask layer 1400, while pervasive nucleation and growth of material do not occur on other surfaces. It is noted herein, however, that any spurious deposition of a material atop the patterned disposable material layer 2110 is not a concern as long as the thickness of such a spurious deposition is small compared to, i.e., less than, the thickness of the patterned disposable material layer 2110. Since the sacrificial layer 3900 is sacrificial, i.e., consumed during the subsequent plasma strip process, which may be optimized to be selective to the hard mask layer 1400. Energetic bombardment by the ions of the plasma during the plasma strip process may be employed to effect such a result.

Non-limiting exemplary sacrificial coating materials include polymeric mixtures of carbon with hydrogen, fluorine, and/or silicon. Such sacrificial coating materials are readily formed in a plasma generated from fluorocarbon or fluorohydrocarbon gases. Utilization of such sacrificial coating materials for control of sidewall profiles during the etching of silicon and silicon containing material is known in the art.

Formation of the sacrificial layer 3900 on the exposed surfaces of the second IMD layer 1300 may be effected by adjusting the ratio of carbon and hydrogen to fluorine in the feed gas. Typically, the ratio is greater than about 1:3. For gases such as $C_4F_8$, $C_2F_6$, $CHF_3$, $CH_2F_2$, etc., there is a strong tendency for deposition to occur on the surfaces that are not subjected to energetic ion bombardment such as sidewall surfaces of the second IMD layer 1300.

It is noted that conventionally such polymeric layers are formed and almost simultaneously removed more or less continuously throughout the etching processes known in the art so that no or little residual polymeric material remaining at the end of the etching process. It is also conventional that any remaining residual polymeric material may be easily removed during a subsequent stripping of masking layers. Formation of a lasting polymeric layer that constitutes the sacrificial layer 3900 that is present in a significant volume after completion of a primary etch process and for the purposes of protecting sidewalls and horizontal surface of the second IMD layer 1300 during all or most of the aforementioned mask stripping step, i.e., during a subsequent removal of the patterned disposable material layer 2110, represents a departure from conventional practices for the specific and novel utility as disclosed in the present invention.

Another method of forming a sacrificial layer 3900 is to take advantage of the silanol enriched nature of the second IMD layer 1300 and to induce a ring opening polymerization reaction. Since silanols are acidic, the ring opening polymerization includes reactions requiring acid catalysis. Non-limiting exemplary ring opening polymerization reactions include reactions with epoxides, epoxy (meth)acrylates, oxetanes, caprolactones, lactides, butyrolactones, tetrahydrofuron (THF) and the like. The sacrificial layer 3900 may be formed by certain cationic polymerization reactions such as formation of styrene, alpha methyl styrene, vinyl acetate, vinyl ethers, etc. The sacrificial layer 3900 may be formed by employing the attachment of initiators such as functional alkyl amine initiators, dithioesters, etc. to the silanols and a subsequent selective initiation from this surface using standard vinyl monomers.

Figures 3C, 3D:
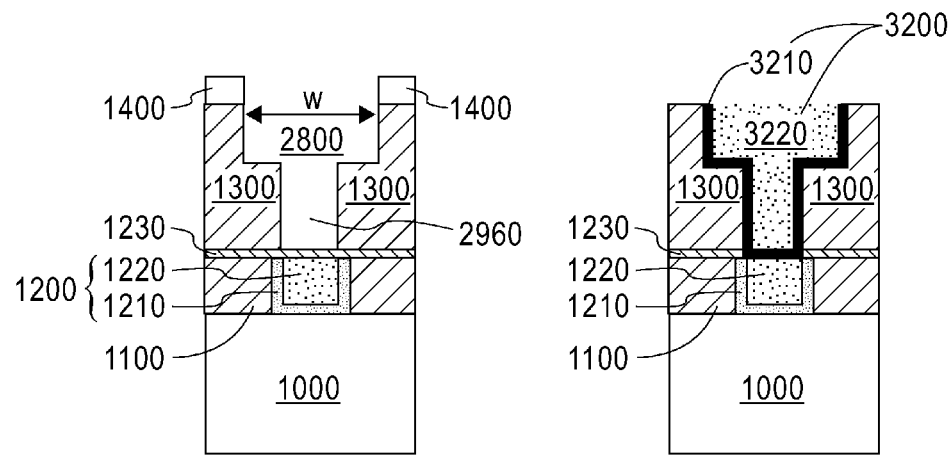

Referring to FIG. 3C, the second exemplary metal interconnect structure is then subjected to a plasma strip process to remove the disposable via fill material from the patterned disposable material layer 2110 and the disposable via fill plug 2710. The second exemplary metal interconnect structure is then subjected to a selective RIE process to open a contact hole in the diffusion barrier dielectric layer 1230. Remaining portions of the sacrificial layer 3900 is consumed during the plasma strip process and the selective RIE process employed to form the contact hole. A wet clean may be performed to remove residual material from the previous plasma processes. Since the sacrificial layer 3900 protects the second IMD layer 1300 throughout the plasma strip process and selective RIE process, plasma damage on the second IMD layer 1300 is avoided. As such, the wet clean does not cause a change in the line width W of the line trench 2800 in contrast to the change of the line width the exemplary prior art metal interconnect structure as exemplified by the difference between the second width W''' in FIG. 1H and the first width W' in FIG. 1G.

Referring to FIG. 3D, metallization, plating, and planarization is performed to form a dual damascene metal interconnect structure 3200 which comprises a second conductive diffusion barrier/adhesion layer 3210 and second level integrated metal line and via 3220 which typically comprise copper. The inventive processing steps may be repeated to construct a multi-level dual damascene metal interconnect structure (not shown).

In case the sacrificial layer 3900 is formed selectively only on the second IMD layer 1300 and optionally on the sidewalls of the hard mask layer 1400 and has a sufficiently low removal rate during the plasma strip process and the selective RIE process for formation of a contact hole so that the second IMD layer 1300 is protected until the end of the selective RIE process, the second embodiment provides all the benefits of the first embodiment.

Illustrative Example 1
Embodiment 1

A batch of 300 mm diameter silicon wafers was precleaned and coated with a 50 nm thick Si(CN) dielectric barrier film using a plasma enhanced CVD process known in the art. Next, a layer of a precursor film containing an organosilicate backbone and a pore forming labile organic agent (termed porogen) was deposited employing a process disclosed in one of U.S. Pat. Nos. 6,312,793; 6,437,443; and 6,479,110 to Grill et al., which are incorporated herein by reference.

The deposited film was then subjected to ultraviolet irradiation at 400° C. for a time period between 5 to 15 minutes to remove the labile porogen from the film and to enable good network crosslinking leading to an organosilicate film with a controlled volume fraction of pores with median diameter nominally less than 2 nm to form an ultra low k intermetal dielectric film. The k value of the ultra low k intermetal dielectric films is tunable and k values between 2.2 and 2.4 were achieved. Films with k=2.4 was utilized for the experiments described below. Following the deposition and curing to form an ultra low k intermetal dielectric film having a thickness of about 450 nm and a k value of 2.4, a hard mask layer comprising an organosilicate material and having a higher k value that is between 2.7 and 3.0 was deposited on top of the ultra low k intermetal dielectric film employing a plasma enhanced CVD process known in the art.

To capture the salient elements of plasma damage exposures encountered in the dual damascene process using a simplified structure, the following method was used in the present example. NFC1400™ from JSR Corporation™, which is an organic disposable via fill material, was coated on top of the hard mask layer to a thickness of 300 nm. A low temperature oxide (LTO) layer of about 40 nm in thickness was deposited by a PECVD process. This was followed by the application and curing of an organic spin on antireflective coating (ARC) and a photoresist layer over the top surface of the LTO layer. Lithographic imaging of a test pattern was performed using a 193 nm stepper (ASML 1200i™). The test pattern contained in particular two test macros of interest. The first test macro contained a comb capacitor structure to enable measurement of line to line capacitance, which is sensitive to the line to line spacing and any change in the ultra low k dielectric constant due to plasma damage during etch and strip processes. The second macro contained an equally spaced line pattern at a nominal pitch in the range of 200 or 260 nm and a line width of about 100 or 130 nm respectively. The second macro is sensitive to line width and height of physical structure of metal lines, and is in indicator of how well the line width is retained between the lithographic printing and the physical structure of the metal lines.

In the control samples which were fabricated on control wafers for comparison using the prior art process, the pattern in the photoresist was transferred successively into the ARC layer, the LTO layer, organic disposable via fill material, the hard mask layer and to a controlled depth into the ultra low k intermetal dielectric film using an appropriate sequence of reactive ion etch (RIE) processes employing plasmas consisting of a mixture of inert gases, fluorocarbon gases and oxygen. This sequence of RIE processes was followed by a plasma strip process in a mildly oxidizing plasma consisting of a combination of gases selected from ammonia, nitrogen, oxygen, and carbon dioxide to enable a full removal of the organic disposable via fill material. Specific details of these RIE and strip processes are known in the art. For the purpose of this experiment, it suffices to note that this sequence of RIE processes is typically utilized in the DD BEOL processing and, as will be shown through our experimental data, modify and damage the ultra low k intermetal dielectric film to a measurable degree. The structure of the control samples was subjected to a second RIE process that simulates the step required to open contact holes in the SiCN layer required in a DD structure. Thus, the line trench in the ultra low k intermetal dielectric film has been subjected to all the plasma exposures it is likely to encounter in a conventional DD build. The control wafers were subjected to a room temperature wet clean in a dilute hydrofluoric acid to effect removal of any residual material from plasma processing and the plasma damaged region on the ultra low k intermetal dielectric film. As known in the art, a significant change in the width of the line trench was observed.

Other wafers in the same lot, which are herein referred to as exemplary wafers with inventive processing, were processed after lithography in the following manner according to the inventive methods of the first embodiment of the present invention. The exemplary wafers with inventive processing were processed through all the steps up to and including the sequence of RIE processes employed for the control wafers. At this point, some of the exemplary wafers with inventive processing were subjected either to a mild wet cleaning or a light plasma strip. The strength of the mild wet clean was roughly one tenth in the amount of cumulative etch removal compared to the standard dilute HF wet clean used for the control samples. Some others of the exemplary wafers with inventive processing were exposed to a light plasma strip which provided about 10% or less time exposure of the standard plasma strip process. The mild wet clean and the light plasma strip are intended to remove any polymeric residues present from the previous RIE process without substantially changing the line width. Unlike the processing of the control wafers, the organic disposable via fill material is not removed by one of the mild wet clean and the light plasma strip.

The exemplary wafers with inventive processing were loaded into a preheated batch furnace, which is a vacuum oven manufactured by YES Inc.™, and allowed to warm up to a process temperature for about 10-15 minutes. Next a dehydration purge comprising three rounds of chamber evacuation to approximately 10 torr with a dry nitrogen backfill after each evacuation was performed to minimize the amount of physically absorbed moisture, if any, in the ultra low k intermetal dielectric film. The last dehydration purge was extended to lower the chamber pressure down to 1 torr. A silylation agent was injected into the furnace and allowed to evaporate and attain a certain vapor pressure inside the furnace at the process temperature employed. Typical silylation process variables are time, reagent volume, reagent pressure, and chamber temperature. The exemplary wafers with inventive processing were processed at a pressure about 10-15 torr and at the temperature of 150° C. for a time period of 30 minutes. The chamber pressure depends on the vapor pressure of the agent at the process temperature, chamber volume, which was 75 liters in the test, and the amount of the agent injected, which was 4 to 5 milliliters in the test. At the end of the silylation cycle, the chamber was purged three times by evacuation to approximately 20 torr with a nitrogen back fill after each evacuation. The samples were then allowed to cool to 50° C. in dry nitrogen and then unloaded for further processing.

A novel aspect of the present invention pertains to the specific silylation agents chosen from the different types specified above for the process of silylation. Another novel aspect of the present invention specifies a step in an integration schemed at which silylation is performed so as to prevent plasma damage. According to the present invention, plasma damage is avoided altogether so that repair of a plasma damaged region is not necessary.

In the exemplary wafers with inventive processing, bis (triethoxysilyl)methane (BTESM) and bis(dimethylaminodimethylsilyl)ethane (BDMSDMSE) were used as the silylation agents. Both of these agents have functional groups (ethoxy or amino) that react with silanols and have carbosilane bonds that impart a degree of resistance to oxidizing plasma strip process. The functional groups react selectively with silanols ubiquitously present on the exposed ultra low k intermetal dielectric film surfaces after the mild wet clean or light plasma strip to enable a selective formation of a contiguous protective layer on the ultra low k intermetal dielectric film during the silylation process. However, silanols are not present in the organic disposable via fill material, thus, formation of any material on the organic disposable via fill material is non-existent or in an inconsequentially small amount.

The exemplary wafers with inventive processing were then introduced into a plasma strip process chamber to remove the organic disposable via fill material and then subjected to the same second RIE process that simulates the step required to open a contact holes in the SiCN layer required in a DD structure in the same manner as in the case of the control wafers. The same standard dilute HF clean of residual materials was performed on the exemplary wafers with inventive processing as on the control wafers. The inventive silylation treatment performed at the above specified point in the dual damascene process sequence protected the ultra low k intermetal dielectric film from plasma damage, and consequently mitigated an increase in the line width of the line trench during the dilute HF wet clean.

At this point all the control wafers and the exemplary wafers with inventive processing were merged into the same lot and subjected to deposition of an adhesion/barrier metal stack (TaN/Ta) and a copper seed layer, trench fill by Cu electroplating, followed by CMP to planarize and achieve an inlaid damascene line structure. The CMP process was such that all the metal over burden and the organosilicate hard mask were polished off in the final metal interconnect structure.

All of the wafers were then electrically tested to measure resistance of the metal lines and the capacitance of the capacitor comb structures at room temperature and 150° C. The testing at 150° C. was performed to evaluate the difference between the control and the exemplary wafers in the absence of any physically absorbed water that might skew the results.

Figure 4:
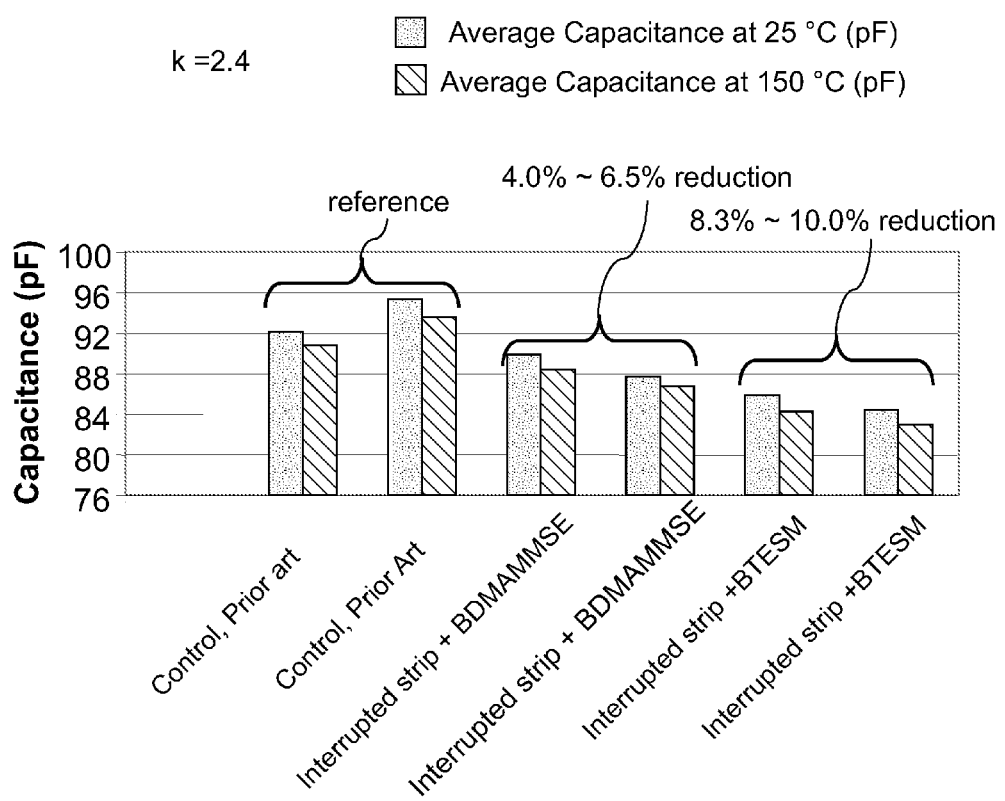
FIG. 4 is a set of data on the capacitance of comb capacitor structures of control parts fabricated by the fabricated by the exemplary prior art via first integration scheme and test parts fabricated by the first embodiment of the present invention.
Figure 5:
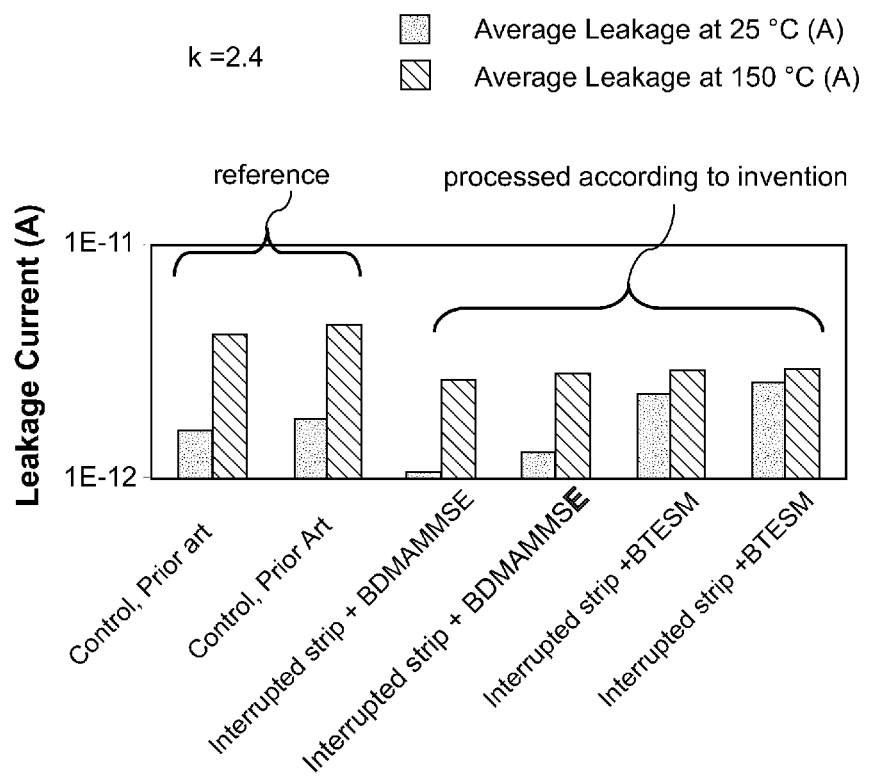
FIG. 5 is a set of data on the intra-line electrical leakage current in comb capacitor structures of the control parts fab-

The results are shown in the illustrative graphs shown in FIGS. 4 and 5. For illustrative purposes, only the exemplary wafers with inventive processing which were processed with the light plasma strip after the sequence of RIE processes are shown in FIGS. 4 and 5. Similar results were also obtained from the exemplary wafers with inventive processing that employed a mild wet clean instead of the light plasma strip.

Referring to FIG. 4, measured values of capacitance are compared across the control wafers that were processed by the prior art process sequence and the exemplary wafers with inventive processing described above. In both the room temperature test data and the 150° C. test data, there is a significant reduction in line to line capacitance in the exemplary wafers with inventive processing relative to the control wafers. While both silylation agents BTESM and BDMADMSE enable this reduced capacitance, the magnitude of reduction in the line to line capacitance is greater with the silylation agent BTESM than with the silylation agent BDMADMSE.

Referring to FIG. 5, dielectric leakage current in amperes are shown, which was measured in the comb capacitor structures at a bias voltage of 1.5 volts that was applied across the comb electrodes. In all the cases, the exemplary wafers with inventive processing show a lower leakage current relative to the control wafers, which is indicative of a less damaged intermetal dielectric layer compared to the control wafers. It should be noted that in the control wafers, most of the plasma damaged region of the intermetal dielectric layer has been removed by the standard dilute HF etching treatment. Despite the removal of most of the plasma damaged region, the leakage current is still higher in the control wafers compared to the exemplary wafers with inventive processing. In contrast, little of the ultra low k intermetal dielectric layer is removed from the exemplary wafer with inventive processing during the final wet clean in the standard dilute HF process and yet lower leakage is observed. Thus, the level of protection offered by protective layer to the underlying ultra low k intermetal dielectric film is sufficiently high to prevent any measurable damage to the underlying ultra low k intermetal dielectric film.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for fabricating an interconnect structure comprising:
    forming an intermetal dielectric layer on a substrate;
    forming a hard mask directly on said intermetal dielectric layer;
    forming a via hole within said hard mask and within said intermetal dielectric layer and filling a lower portion of said via hole with a disposable via fill material;
    forming a line trench in said intermetal dielectric layer over said via hole;
    forming a sacrificial layer on sidewalls of said line trench and on sidewalls of an upper portion of said via hole, while keeping a bottom surface of said line trench nominally exposed, wherein said sacrificial layer includes a polymeric material containing carbon, hydrogen, fluorine, and silicon; and
    performing a plasma strip to remove said disposable via fill material, while portions of said intermetal dielectric layer underneath said sidewalls of said line trench and underneath sidewalls of an upper portion of said via hole are protected by said sacrificial layer from damage during said plasma strip, wherein said sacrificial layer is consumed during said plasma strip.

2. The method of claim 1, wherein said sacrificial layer is formed by a plasma process.

3. The method of claim 2, wherein said plasma process includes at least one feed gas selected from the group consisting of $C_4F_8$, $C_2F_6$, $CHF_3$, and $CH_2F_2$.

4. The method of claim 1, wherein said forming the sacrificial layer is performed utilizing a feed gas ratio of carbon and hydrogen to fluorine of greater than 3:1.

5. The method of claim 1, wherein said polymeric material is formed by employing a plasma bias that promotes energetic ion bombardment.

6. The method of claim 1, wherein said sacrificial layer is formed by an acid catalyzed ring opening polymerization reaction.

7. The method of claim 6, wherein said acid catalyzed ring opening polymerization reaction employs at least one of epoxy (meth)acrylates, oxetanes, caprolactones, lactides, butyrolactones, and tetrahydrofuron (THF).

8. The method of claim 1, wherein said sacrificial layer is one of styrene, alpha methyl styrene, vinyl acetate, and vinyl ethers.

9. The method of claim 1, further comprising:
    attaching initiators selected from the group consisting of functional alkyl amine initiators and dithioesters to said sidewalls of said line trench and to said sidewalls of an upper portion of said via hole; and
    a selective initiation employing vinyl monomers from said sidewalls of said line trench and from said sidewalls of an upper portion of said via hole.

10. The method of claim 1, further comprising:
    forming a diffusion barrier dielectric layer on said substrate prior to said forming of said intermetal dielectric layer;
    etching a contact hole through said diffusion barrier dielectric layer after said performing of said plasma strip; and
    filling said contact hole, said via hole, and said line trench with a conductive barrier metal liner and a conductive via fill material.

11. The method of claim 10, wherein said diffusion barrier dielectric layer comprises at least one of silicon nitride, silicon carbide, and silicon-carbonitride material that is deposited by plasma enhanced chemical vapor deposition or spin on coating.

12. The method of claim 10, further comprising:
    forming a hard mask on said intermetal dielectric layer; and
    planarizing said conductive barrier metal liner and said conductive via fill material.

13. The method of claim 12, wherein said hard mask layer comprises one of silicon oxide, silicon nitride, silicon-oxycarbide, and combinations thereof.

14. The method of claim 1, wherein said substrate comprises a semiconductor material and contains at least one semiconductor device and at least one interconnect wiring.

15. The method of claim 1, wherein said intermetal dielectric layer comprises a porous organosilicate dielectric material, wherein said porous organosilicate dielectric material includes silicon, carbon, oxygen and hydrogen.

* * * * *